United States Patent [19]
Yamada

[11] Patent Number: 5,430,312
[45] Date of Patent: Jul. 4, 1995

[54] CHARGE MODULATED DEVICE

[75] Inventor: Manabu Yamada, Kanagawa, Japan

[73] Assignee: Sony Corporation, Tokyo, Japan

[21] Appl. No.: 264,482

[22] Filed: Jun. 23, 1994

[30] Foreign Application Priority Data

Jun. 24, 1993 [JP] Japan .................. 5-153546

[51] Int. Cl.$^6$ ............... H01L 27/02; H01L 27/14; H01L 31/00; H01L 27/10
[52] U.S. Cl. .................... 257/291; 257/443
[58] Field of Search ............... 257/291, 443

[56] References Cited

U.S. PATENT DOCUMENTS

| 4,901,129 | 2/1990 | Hynecek | 257/291 |
| 5,317,174 | 5/1994 | Hynecek | 257/291 |

*Primary Examiner*—Gene M. Munson
*Attorney, Agent, or Firm*—Hill, Steadman & Simpson

[57] ABSTRACT

A sensitivity of light of long wavelength in a charge modulated device can be improved and a capability for storing photogenerated electric charges in a charge modulated pixel transistor is increased. In a charge modulated device using charge modulated pixel transistors, a charge modulated pixel transistor (31) includes in its bulk formed under the gate a charge accumulation region (35) for storing photoelectrically-converted holes formed of a $P^{30}$ semiconductor region (37) and a P semiconductor region (38) formed under the P+ semiconductor region (37). This charge accumulation region (35) has an impurity profile in which an impurity concentration is decreased in the depth direction.

16 Claims, 7 Drawing Sheets

CHARGE MODULATED DEVICE

BACKGROUND OF THE INVENTION

1. Field of the Invention

The present invention relates to an amplifier type solid state imaging device and, particularly relates to a charge modulated device.

2. Description of the Prior Art

An example of a conventional charge modulated device will be described below with reference to FIGS. 1 and 2.

Heretofore, charge modulated devices include as pixels MOS (metal oxide semiconductor) transistors (hereinafter referred to as charge modulated pixel transistors) in which photoelectrically-converted electric charges (i.e., photogenerated electric charges) are stored under the gate electrode and a drain current is modulated and amplified by the above-mentioned electric charges.

Figure 1:
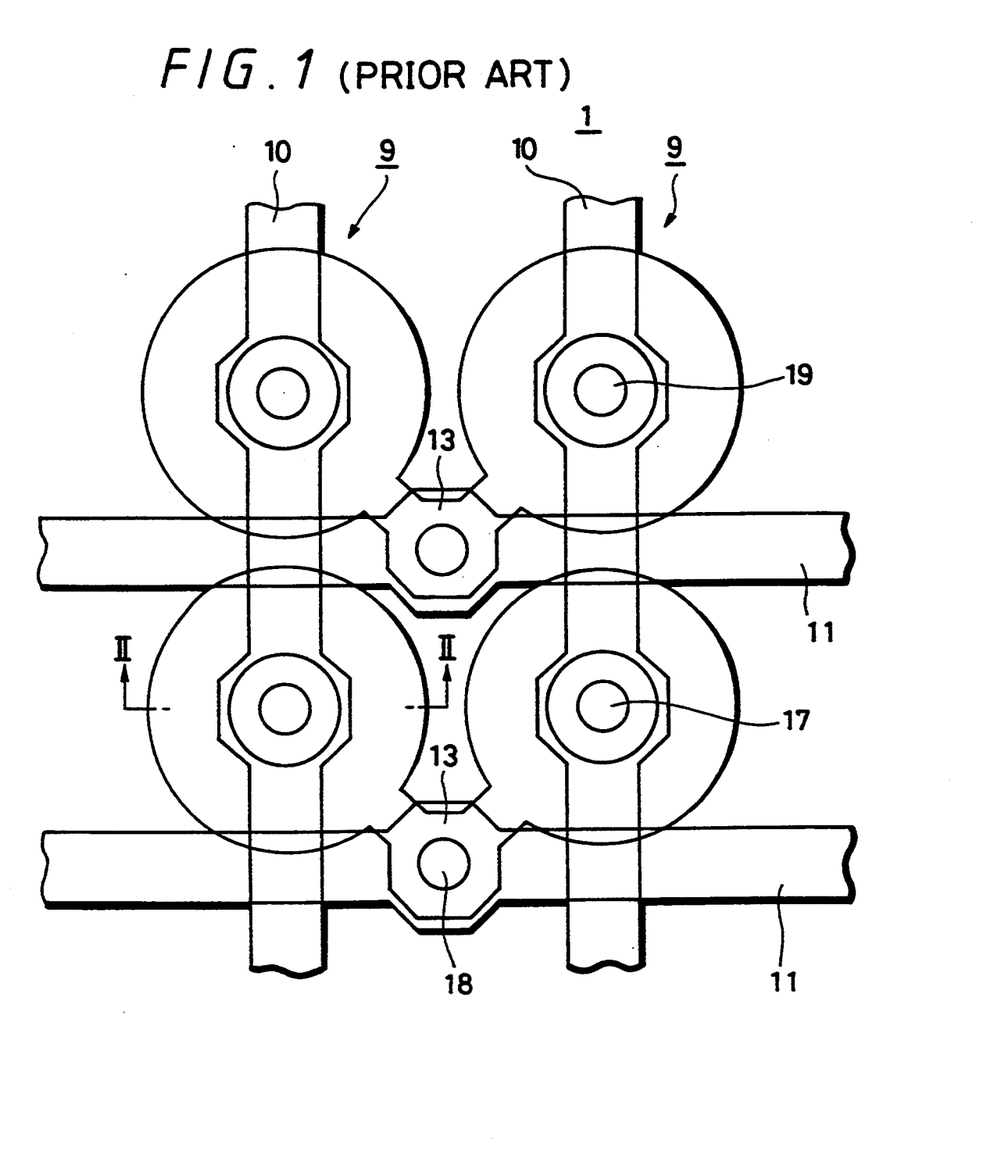
FIG. 1 is a plan view showing a conventional charge modulated device.
Figure 2:
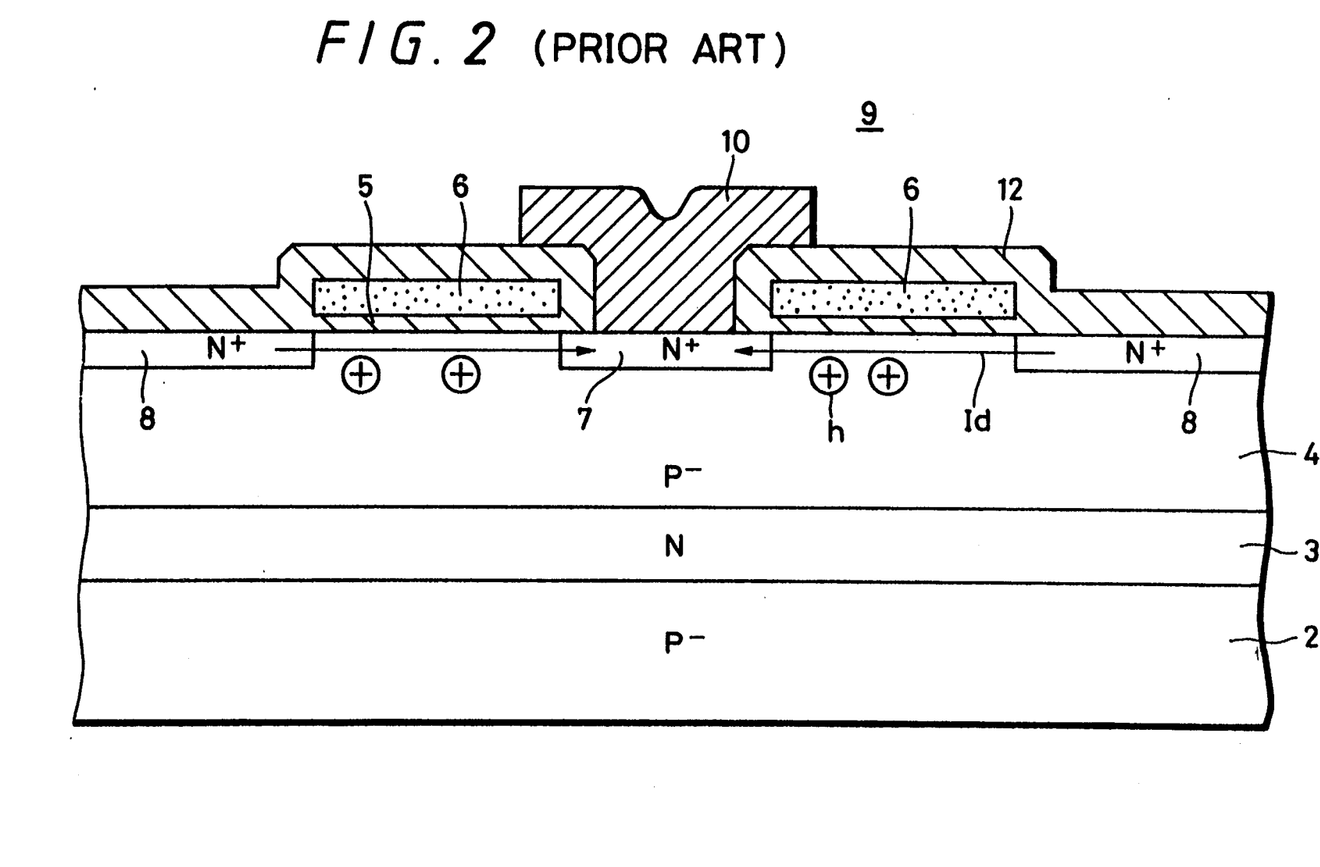
FIG. 2 is a cross-sectional view taken along the line II—II in FIG. 1.

FIG. 1 is a plan view showing a structure of a conventional charge modulated device, and FIG. 2 is a cross-sectional view taken along the line II—II in FIG. 1. As shown in FIG. 2, an N-type well region 3 and a P-type well region 4 are formed on a P-type silicon semiconductor substrate 2. On the P-type well region 4 is formed an annular gate electrode 6 made of light-translucent thin film polycrystalline silicon through a gate insulating layer 5, such as an $SiO_2$ layer or the like. An N-type source region 7 and an N-type drain region 8 are formed on the well region 4 corresponding to the center hole and the outer periphery of the annular gate electrode 6 by self-alignment using the gate electrode as a mask, thereby a charge modulated pixel transistor 9 which serves as a pixel being formed. In FIG. 2, reference numeral 12 depicts an interlayer insulator.

As shown in FIG. 1, a plurality of charge modulated pixel transistors 9 are disposed in columns and rows in which the source regions 7 of the charge modulated pixel transistors 9 corresponding to respective columns are connected to a common signal line 10 formed of a first Al layer and the annular gate electrodes 6 of the charge modulated pixel transistors 9 corresponding to respective rows are connected to a common vertical selection line 11 formed of a second Al layer, for example. In FIG. 1, reference numeral 17 depicts a so-called source contact section to which the source region 7 and the signal line 10 are connected. Reference numeral 18 identifies a so-called gate contact section to which an integral deriving electrode 48 led out from a part of the annular gate electrode 6 and the vertical selection line 11 are connected.

As shown in FIG. 2, in the charge modulated pixel transistor 9, light passed through the annular gate electrode 6 generates electron-hole pair, and holes h are stored in the bulk formed under the annular gate electrode 6 as signal charges.

When a positive voltage is applied to the annular gate electrode 6 through the vertical selection line 11 shown in FIG. 1 to render the charge modulated transistor 9 conductive, a drain current Id is cause flow to to the surface (i.e., channel region). Since the drain current Id is modulated by the signal charges h accumulated under the annular gate electrode 6, the drain current Id is output through the signal line 10 and the modulated amount of the drain current Id is read out.

Specifically, in the charge modulated device 1, when the positive bias is applied to the gate electrode to render the charge modulated pixel transistor conductive, the channel potential modulated by the photogenerated holes stored under the gate electrode is read out as a pixel signal in the form of current or voltage through an output circuit (not shown).

OBJECTS AND SUMMARY OF THE INVENTION

In view of the aforesaid aspects, it is an object of the present invention to provide a charge modulated device in which a spectral characteristic can be improved.

It is another object of the present invention to provide a charge modulated device in which a capability of storing photogenerated charges can be increased.

According to an aspect of the present invention, there is provided a charge modulated device including a plurality of MOS transistors, each of the MOS transistors which comprises a semiconductor substrate of first conductivity type, a gate electrode disposed on the semiconductor substrate through a gate insulating layer, source and drain regions formed in spaced relation to each other in a surface of the semiconductor substrate to define a channel region, an overflow barrier region formed on the semiconductor substrate of first conductivity type, a lightly doped semiconductor region of first conductivity type formed on the overflow barrier region, and a heavily doped semiconductor region of first conductivity type formed between the channel region and the lightly doped semiconductor region of first conductivity type.

According to another aspect of the present invention, there is provided a charge modulated device including a plurality of MOS transistors, each of the MOS transistors which comprises a semiconductor substrate of first conductivity type, an overflow barrier region formed on the semiconductor substrate of first conductivity type, a gate electrode formed on the surface of the semiconductor substrate of first conductivity type through an insulating layer, a channel region formed on the surface of the semiconductor substrate of first conductivity type at its position corresponding to a lower portion of the gate electrode, and a charge accumulation region formed under the channel region for accumulating photoelectrically-converted electric charges.

The above and other objects, features, and advantages of the present invention will become apparent from the following detailed description of illustrative embodiments thereof to be read in conjunction with the accompanying drawings.

DETAILED DESCRIPTION OF THE PREFERRED EMBODIMENTS

The present invention will now be described with reference to the accompanying drawings.

Figure 3:
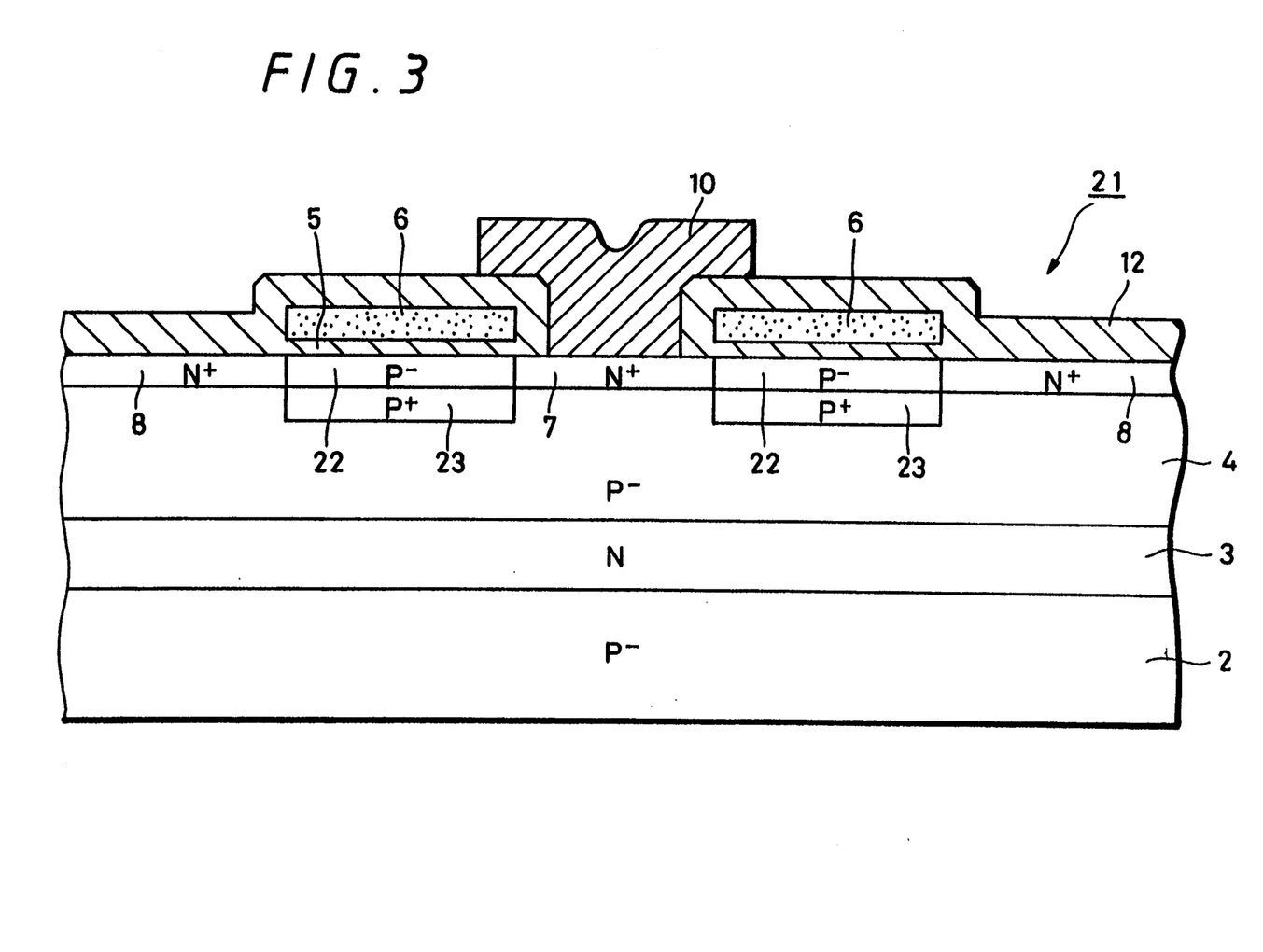
FIG. 3 is a cross-sectional view showing a charge modulated pixel transistor used in a charge modulated device according to an embodiment of the present invention.

FIG. 3 is a cross-sectional view showing a charge modulated device 21 according to a first embodiment of the present invention.

As shown in FIG. 3, the charge modulated pixel transistor 21 includes, in addition to the structure shown in FIG. 2, a P+ charge accumulation region 23 for accumulating photogenerated holes h formed on a lower portion of a P− channel region 22 formed under the annular gate electrode 6. The remainder of the arrangement shown in FIG. 3 is similar to that of FIG. 2.

In this charge modulated pixel transistor 21, similarly to FIG. 2, photogenerated holes h are stored in the P+ charge accumulation region 23 formed under the annular gate electrode 6. When the positive voltage is applied to the annular gate electrode 6 to render the charge modulated pixel transistor 21 conductive, the drain current Id flowing to the channel region 22 is modulated by the photogenerated holes h and the modulated amount of the drain current Id is read out as a pixel signal in the form of current or voltage through an output circuit (not shown).

Figure 4:
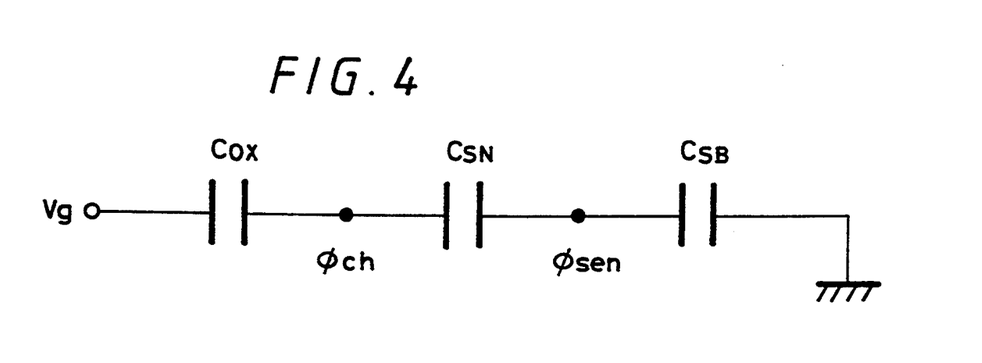
FIG. 4 is a diagram of a one-dimensional capacitance model used to explain the charge modulated pixel transistor shown in FIG. 3.

In order to consider a gain of a pixel, a one-dimensional capacitance model shown in FIG. 4 will be examined.

In FIG. 4, reference symbol $C_{ox}$ depicts a capacitance of a gate insulating layer (SiO2 layer), $C_{SN}$ depicts a capacitance obtained between the silicon surface and the charge accumulation region 23, $C_{SB}$ depicts a capacitance obtained between the charge accumulation region 23 and the end of a depletion layer, and Vg depicts a voltage applied to the gate electrode 6. Further, in FIG. 4, reference symbol $\phi_{ch}$ depicts a channel potential and $\phi_{sen}$ depicts a potential (sensor potential) of the charge accumulation region 23.

Assuming now that S is a gate area, $\epsilon_{sio2}$ is a dielectric constant of the gate insulating layer, $\epsilon_{si}$ is a dielectric constant of silicon, $d_{sio2}$ is a thickness of the gate insulating layer, $d_{SN}$ is a depth from the silicon surface of the charge accumulation region 23 and that W is a depth from the charge accumulation region 23 to the end of the depletion layer, then $C_{OX}$, $C_{SN}$ and $C_{SB}$ are expressed by the following equation (1):

$$C_{OX} = \frac{\epsilon_{sio2} \times S}{d_{sio2}} \quad (1)$$

$$C_{SN} = \frac{\epsilon_{si} \times S}{d_{SN}}$$

$$C_{SB} = \frac{\epsilon_{si} \times S}{W}$$

From the above-mentioned equation (1), a relationship between a potential fluctuation $\Delta\phi_{ch}$ of the surface channel and a sensor potential fluctuation $\Delta\phi_{sen}$ is expressed by the following equation (2):

$$\Delta\phi_{ch} = \frac{\frac{1}{C_{OX}}}{\frac{1}{C_{OX}} + \frac{1}{C_{SN}}} \Delta\phi_{sen} \quad (2)$$

$$= \frac{C_{SN}}{C_{OX} + C_{SN}} \Delta\phi_{sen}$$

Study of the equation (2) reveals that the potential fluctuation $\Delta\phi_{ch}$ of the surface channel becomes large as the capacitance $C_{SN}$ becomes larger, i.e., the depth $d_{SN}$ of the charge accumulation region 23 becomes shallower if the sensor potential fluctuation $\Delta\phi_{sen}$ is constant.

Therefore, in the charge modulated pixel transistor 21 shown in FIG. 3, if the charge accumulation region 23 is formed in the silicon surface as near as possible, then the gain of the pixel becomes high.

In order to form the charge accumulation region 23 near the silicon surface, the charge accumulation region 23 is formed by implanting ions with smaller implantation energy.

Figure 5:
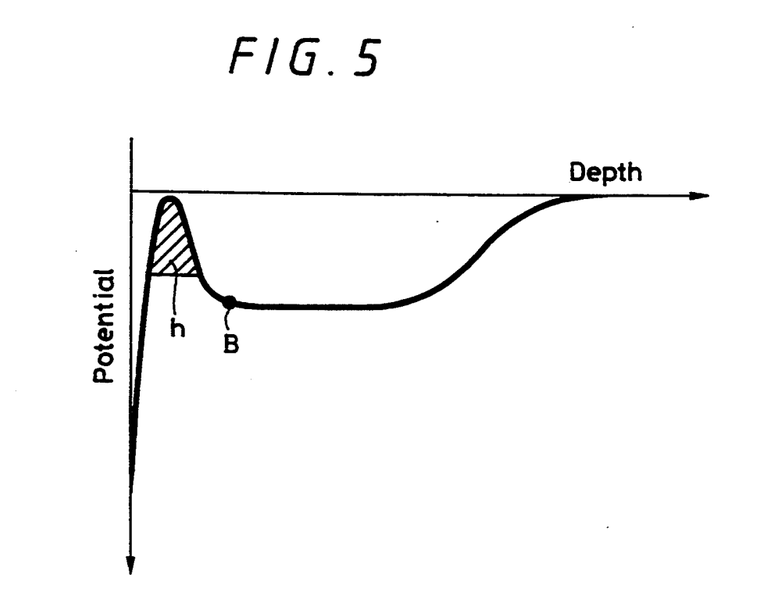
FIG. 5 is an electrostatic potential profile obtained when a signal is read out from the charge modulated pixel transistor shown FIG. 3.

The charge modulated pixel transistor 21 shown in FIG. 3 provides an electrostatic potential profile obtained when the pixel signal is read out, for example, as shown in FIG. 5. Although the photogenerated holes h are stored in the portion shown hatched in FIG. 5, the amount in which the photogenerated holes h are stored in the hatched portion is small so that the holes h tend to be overflowed. Furthermore, since a point B of the overflow position is shallow from the silicon surface, the holes h photoelectrically-converted by light of long wavelength, such as red light or the like, are difficult to be stored.

Therefore, this charge modulated device has a low dynamic range and a poor spectral characteristic in which red sensitivity is lowered.

A charge modulated device according to a second embodiment of the present invention will be described below with reference to FIGS. 6 to 8.

Figure 6:
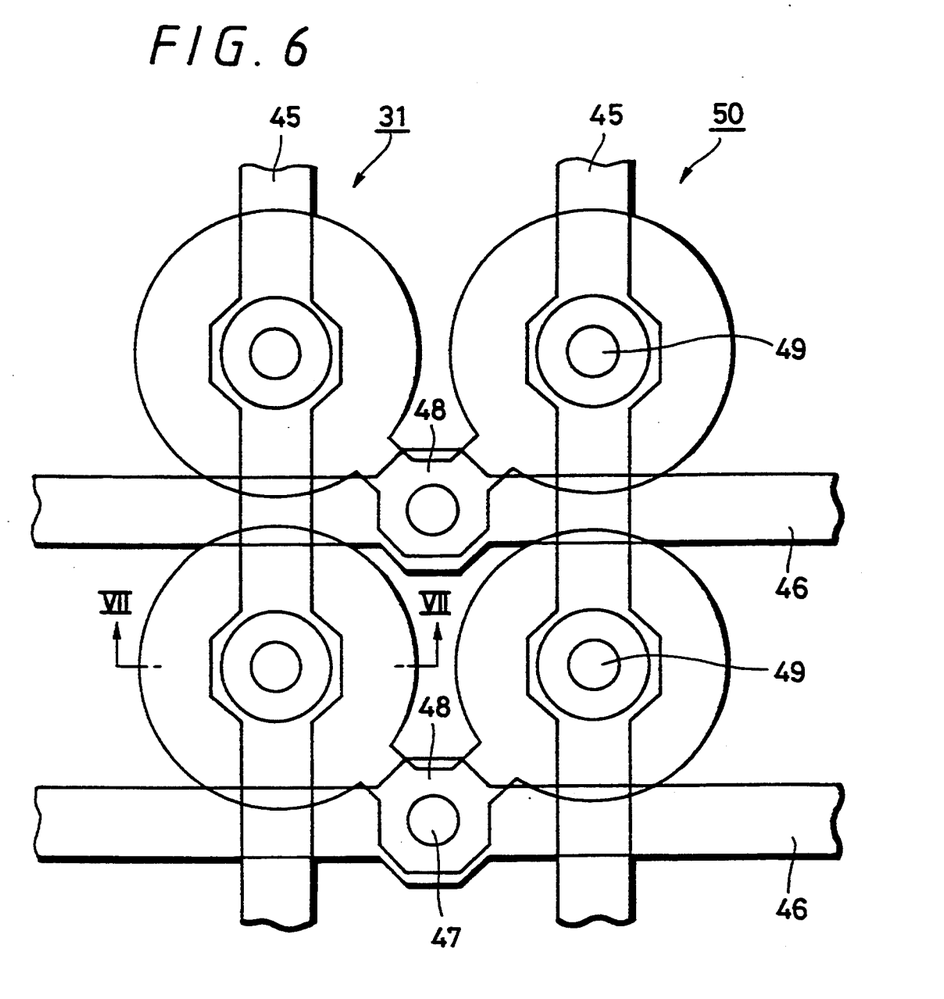
FIG. 6 is a plan view showing a charge modulated device according to another embodiment of the present invention.
Figure 7:
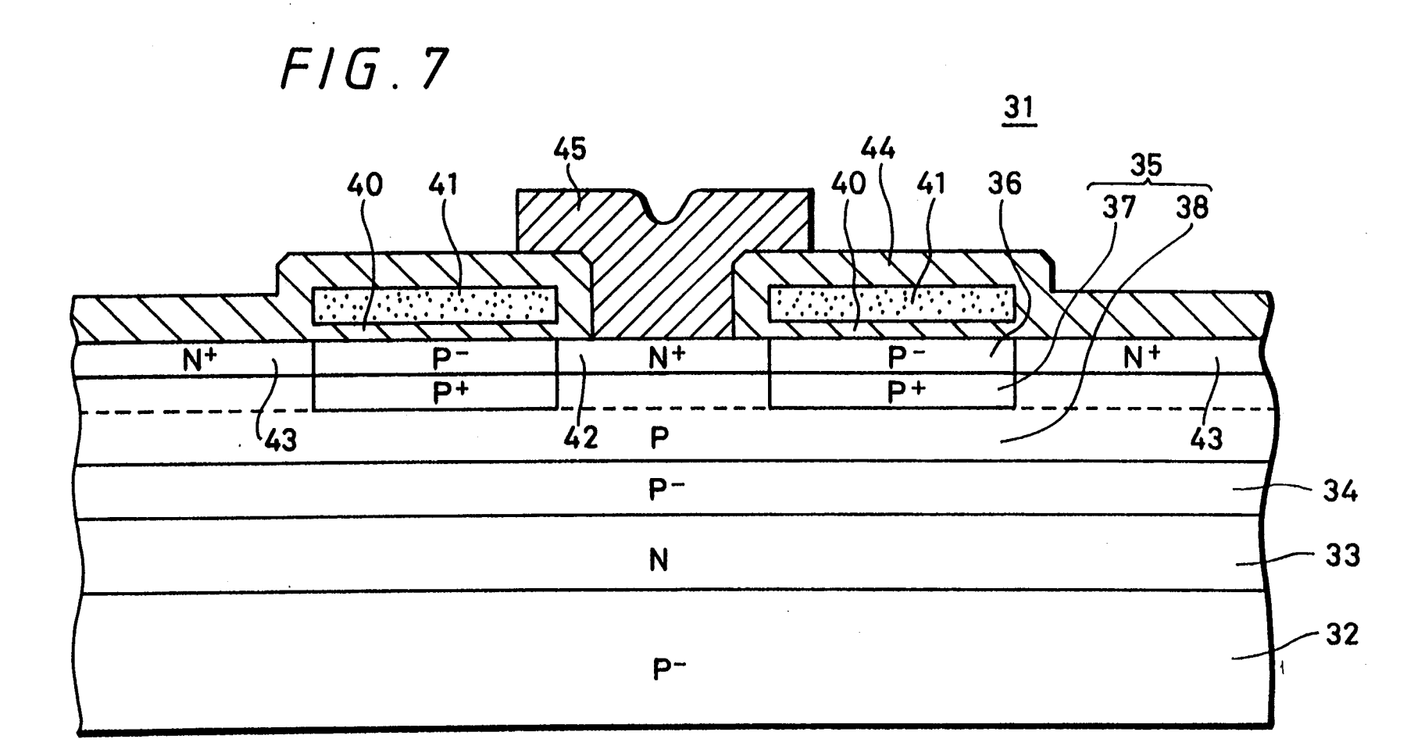
FIG. 7 is a cross-sectional view taken along the line VII—VII in FIG 6.

In this embodiment, as shown in FIG. 7 (cross-sectional view taken along the line VII—VII in FIG. 6), on a semiconductor substrate of first conductivity type, i.e., P-type lightly doped silicon substrate 32, for example, is formed a well region 33 of second conductivity type, i.e., N type which serves as an overflow barrier region for preventing photogenerated holes h from being overflowed. A P− type lightly doped semiconductor region 34 is formed on the N-type well region 34. The P− type semiconductor region 34 has at its portion corresponding at least to the gate formed a P-type charge accumulation region 35 in which photogenerated holes h are stored.

According to this embodiment, the P type charge accumulation region 35 is comprised of a P+ type heavily doped semiconductor region 37 formed in the bulk provided in the silicon surface (channel region 36) as near as possible and a P semiconductor region 38 having an intermediate impurity concentration (i.e., intermediate impurity concentration between that of the P+ semiconductor region 37 and that of the P− semiconductor region 34) formed under the P+ semiconductor region 37 such that a gentle impurity profile is formed in the depth direction.

Alternatively, the P semiconductor region 38 may be formed from the P+ semiconductor region 37 to the depth direction or up to the N-type well region 33 such that the concentration is progressively or successively decreased.

On the silicon surface is formed an annular gate electrode 41 made of a light-translucent thin film polycrystalline silicon through a gate insulating layer 40, such as an $SiO_2$ layer or the like. The annular gate electrode 41 has at its regions corresponding to a center hole and outer periphery formed an N type source region 42 and N type drain regions 43 by self-alignment using the gate electrode 41 as a mask.

The N-type well region 33 is formed on the P type lightly doped silicon substrate 32 by implanting ions with large implantation energy. Therefore, the upper P− semiconductor region 34 segmented by the N type well region 33 presents the same impurity concentration as that of the P type silicon substrate 32.

The P+ semiconductor region 37 constructing the charge accumulation region 35 can be formed as follows.

Initially, a heavily doped P-type semiconductor region with a diffusion center of a predetermined depth is formed on the surface portion of the silicon substrate 32 by implanting P-type impurity (e.g., boron (B)) on the whole pixel section area.

Then, after the thin film serving as the gate electrode 41 is formed through the insulating layer 40, the gate electrode 41 is formed by patterning the above-mentioned thin film, whereafter N-type impurity (e.g., phosphorous (P)) is implanted on the surface of the silicon substrate 32 by using the gate electrode 41 as a mask. By the implantation of ions, the N-type source and drain regions 42 and 43 are formed on the surface of the silicon substrate 32 in a self-alignment.

Also, at that time, of the heavily doped P-type semiconductor region, a lightly doped P-type semiconductor region is formed by reducing the P-type impurity concentration in the regions formed under the source and drain regions 42 and 43 by the introduction of the N-type impurity. Therefore, the heavily doped P-type semiconductor region, i.e., the P+ semiconductor region 37 constructing the charge accumulation region 35 can be formed only under the gate electrode 41. Incidentally, the impurity concentration of the P− channel region 36 formed beneath the gate electrode 41 is the same as that of the silicon substrate 32.

The P semiconductor region (so-called well region) 38 constructing the charge accumulation region 35 can be formed by implanting ions with implantation energy of about several 100s of kiloelectron Volts by using the same mask as that used when the N type well region 33 or P+ semiconductor region 37, for example, is formed. In the illustrated embodiment, the P type semiconductor region 38 is formed with an impurity concentration higher than that of the semiconductor substrate 32 by about 1 to 2 figures, for example.

The charge modulated pixel transistor 31 which forms one pixel is constructed in this way. In FIG. 7, reference numeral 44 depicts an interlayer insulator.

A plurality of charge modulated pixel transistors 31 are provided in columns and rows as shown in FIG. 6. As shown in FIG. 6, the source regions 42 of the charge modulated pixel transistors 31 corresponding to respective columns are connected to a common signal line 45 made of a first Al layer. Also, the annular gate electrodes 41 of charge modulated pixel transistors 31 corresponding to respective rows are connected to a common vertical selection line 46 made of a second Al layer, for example, thus to make a charge modulated device 50. In FIG. 6, reference numeral 47 depicts a so-called gate contact section to which there are connected an integral deriving electrode section 48 led out from a part of the gate electrode 41 and the vertical selection line 46. Reference numeral 49 depicts a so-called source contact section to which there are connected the source region 42 and the signal line 45.

According to the above-mentioned structure, the gain of the pixel can be increased by forming the P+ semiconductor region 37 constructing the charge accumulation region 35 near the silicon surface. Further, the optimum impurity profile in which the impurity profile in the depth direction of the charge accumulation region 35 is gently decreased can be presented by forming the P semiconductor region forming the charge accumulation region 35 together with the P+ semiconductor region 37, i.e., the P semiconductor region 38 having the intermediate impurity concentration between those of the P+ semiconductor region 37 and the P− semiconductor region 34 or whose concentration is progressively decreased in the depth direction under the P+ semiconductor region 37. Thus, the electrostatic potential profile obtained when the pixel signal is read out is presented as shown in FIG. 8.

Figure 8:
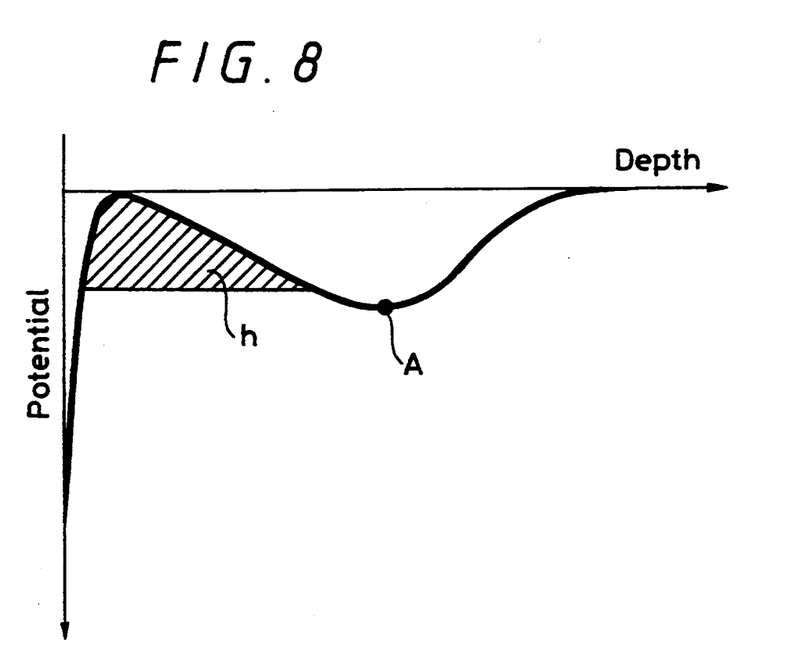
FIG. 8 is an electrostatic potential profile obtained when a signal is read out from the charge modulated pixel transistor according to the present invention.

In FIG. 8, the photogenerated holes h are stored in the hatched portion and the hatched portion indicates a capability for storing holes. Having compared the electrostatic potential profile shown in FIG. 8 with that of FIG. 5, it is to be understood that the area is increased, resulting in the increase of the accumulation amount of the photogenerated holes h. That is, the capability for storing the photogenerated holes h can be increased.

Moreover, the overflow position is moved from the point B in FIG. 5 to a point A in the depth direction of FIG. 8, i.e., the depth becomes sufficient (e.g., 2 to 3 $\mu m$) so that the holes h photoelectrically-converted by visible red light can be sufficiently stored in the charge accumulation region 35. Accordingly, the photogenerated holes obtained by light of long wavelength, such as red light or the like, can effectively be stored in the charge accumulation region 35, thereby red sensitivity being improved.

Light of long wavelength, such as red light or the like, has a small absorption coefficient in the semiconductor. Therefore, when absorbed, light of long wavelength reaches to the depth of several micrometers from the surface. During this period, the above-mentioned light of long wavelength contributes to the photoelectric conversion. If the overflow position A is further moved in the depth direction, then light of long wavelength, such as red light or the like, can be used sufficiently and the dynamic range is widened, thereby obtaining a satisfactory spectral characteristic.

In the structure according to this embodiment, since the P+ semiconductor region 37 is formed by implanting ions with extremely low implantation energy in order to increase the gain of the pixel, the lowered capability of storing photogenerated holes and the lowered red sensitivity can be improved and further increased.

Since the P type semiconductor region 38 constructing the charge accumulation region 35 is formed by implanting ions on the whole pixel section, the P type semiconductor region 38 can be formed by using the same mask as that used when the N type well region 33 serving as the overflow barrier region or the P+ semiconductor region 37 is formed. Therefore, the charge modulated pixel transistor 31 of the structure shown in FIG. 7 can be formed by a simple manufacturing process.

While the charge accumulation region is formed as the conductivity type to store the holes as described above, the present invention is not limited thereto and the charge accumulation region may be formed as a conductivity type to store electrons.

According to the charge modulated device of the present invention, the electrostatic potential profile obtained when the signal in the charge accumulation region is read out can be optimized so that the sensitivity of light of long wavelength can be increased and the spectral characteristic can be increased. Moreover, the accumulation capability in the charge modulated pixel transistor can be increased. Therefore, the present invention can suitably be applied to the visible light charge modulated device.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A charge modulated device including a plurality of MOS transistors, each of said MOS transistors comprising:
   a semiconductor substrate of first conductivity type;
   a gate electrode disposed on said semiconductor substrate through a gate insulating layer;
   source and drain regions formed in spaced relation to each other in a surface of said semiconductor substrate to define a channel region;
   an overflow barrier region formed in said semiconductor substrate of first conductivity type;
   a lightly doped semiconductor region of first conductivity type formed on said overflow barrier region; and
   a heavily doped semiconductor region of first conductivity type formed between said channel region and said lightly doped semiconductor region of first conductivity type.

2. The charge modulated device according to claim 1, further comprising a semiconductor region of first conductivity type formed between said heavily doped semiconductor region of first conductivity type and said lightly doped semiconductor region of first conductivity type, an impurity concentration of said semiconductor region of first conductivity type being lower than that of said heavily doped semiconductor region of first conductivity type and higher than that of said lightly doped semiconductor region of first conductivity type.

3. The charge modulated device according to claim 2, wherein said semiconductor region of first conductivity type has a constant concentration.

4. The charge modulated device according to claim 2, wherein said semiconductor region of first conductivity type is arranged such that an impurity concentration thereof is progressively or successively decreased from said heavily doped semiconductor region of first conductivity type to a depth direction.

5. The charge modulated device according to claim 2, wherein said channel region is formed in a lightly doped semiconductor region of first conductivity type.

6. The charge modulated device according to claim 2, wherein an impurity concentration of said semiconductor substrate of first conductivity type is substantially the same as that of said lightly doped semiconductor substrate of first conductivity type.

7. The charge modulated device according to claim 2, wherein an impurity concentration of said semiconductor substrate of first conductivity type is substantially the same as that of said channel region.

8. The charge modulated device according to claim 2, wherein said overflow barrier region is of the second conductivity type which is an opposite conductivity type of said first conductivity type.

9. The charge modulated device according to claim 1, wherein said gate electrode is an annular gate electrode.

10. A charge modulated device including a plurality of MOS transistors, each of said MOS transistors comprising:
    a semiconductor substrate of first conductivity type;
    an overflow barrier region formed in said semiconductor substrate of first conductivity type;
    a gate electrode formed on the surface of said semiconductor substrate of first conductivity type through an insulating layer;
    a channel region formed on the surface of said semiconductor substrate of first conductivity type at its position corresponding to a lower portion of said gate electrode; and
    a charge accumulation region formed under said channel region for accumulating photoelectrically-converted electric charges, said charge accumulation region having a concentration profile in which an impurity concentration is decreased in the depth direction.

11. The charge modulated device according to claim 10, wherein said charge accumulation region is formed of a heavily doped semiconductor region of first conductivity type formed under said channel region.

12. The charge modulated device according to claim 10, wherein said gate electrode is an annular gate electrode.

13. A charge modulated device, including a plurality of MOS transistors, each of said MOS transistors comprising:
    a semiconductor substrate of first conductivity type;
    an overflow barrier region formed in said semiconductor substrate of first conductivity type;
    a gate electrode formed on the surface of said semiconductor substrate of first conductivity type through an insulating layer:
    a channel region formed on the surface of said semiconductor substrate of first conductivity type at its position corresponding to a lower portion of said gate electrode; and
    a charge accumulation region formed under said channel region for accumulating photoelectrically-converted electric charges, wherein said charge accumulation region is formed of a heavily doped semiconductor region of first conductivity type formed under said channel region and a semiconductor region of first conductivity type whose impurity concentration is lower than that of said heavily doped semiconductor region of first conductivity type.

14. The charge modulated device according to claim 13, wherein a lightly doped semiconductor region of first conductivity type whose impurity concentration is lower than that of said semiconductor region of first conductivity type is formed between said charge accumulation region and said overflow barrier region.

15. The charge modulated device according to claim 13, wherein said semiconductor region of first conductivity type has an impurity concentration in which an impurity concentration is progressively or successively decreased from said heavily doped semiconductor region of first conductivity type to the depth direction.

16. The charge modulated device according to claim 13, wherein said gate electrode is an annular gate electrode.

* * * * *